United States Patent
Wu et al.

(10) Patent No.: US 7,517,477 B2
(45) Date of Patent: *Apr. 14, 2009

(54) POLYDIAZAACENES AND ELECTRONIC DEVICES GENERATED THEREFROM

(75) Inventors: Yiliang Wu, Mississauga (CA); Ping Liu, Mississauga (CA); Beng S. Ong, Mississauga (CA)

(73) Assignee: Xerox Corporation, Norwalk, CT (US)

(*) Notice: Subject to any disclaimer, the term of this patent is extended or adjusted under 35 U.S.C. 154(b) by 512 days.

This patent is subject to a terminal disclaimer.

(21) Appl. No.: 11/398,941

(22) Filed: Apr. 6, 2006

(65) Prior Publication Data

US 2007/0235720 A1 Oct. 11, 2007

(51) Int. Cl.
*H01B 1/12* (2006.01)
(52) U.S. Cl. .................. 252/500; 544/342; 528/422; 257/40
(58) Field of Classification Search ................ 252/500; 544/342–344; 528/373, 422; 257/40
See application file for complete search history.

(56) References Cited

U.S. PATENT DOCUMENTS

| | | | | |
|---|---|---|---|---|
| 3,598,766 | A * | 8/1971 | Marvel | 528/422 |
| 5,619,357 | A | 4/1997 | Angelopoulos et al. | |
| 5,777,070 | A | 7/1998 | Inbasekaran et al. | |
| 5,849,403 | A * | 12/1998 | Aoki et al. | 428/220 |
| 5,969,376 | A | 10/1999 | Bao | |
| 6,107,117 | A | 8/2000 | Bao et al. | |
| 6,150,191 | A | 11/2000 | Bao | |
| 6,770,904 | B2 | 8/2004 | Ong et al. | |
| 6,869,699 | B2 * | 3/2005 | Klubek et al. | 428/690 |
| 7,399,432 | B2 * | 7/2008 | Herron et al. | 252/500 |
| 2005/0017311 | A1 | 1/2005 | Ong et al. | |
| 2006/0103911 | A1 * | 5/2006 | Baumann et al. | 359/265 |
| 2008/0121873 | A1 * | 5/2008 | Katakura et al. | 257/40 |

OTHER PUBLICATIONS

Ong, Beng, et al., U.S. Appl. No. 11/011,678, filed Dec. 14, 2004 on Compound with Indolocarbazole Moieties and Devices Containing Such Compound.
Ong, Beng, et al., U.S. Appl. No. 11/167,512, filed Jun. 27, 2005 on Compound with Indolocarbazole Moieties and Devices Containing Such Compound.
Huang, D.H., et al., "Conjugated Polymers Based on Phenothiazine and Fluorene in Light-Emitting Diodes and Field Effect Transistors", *Chem. Mater.* 2004, 16, 1298-1303.
Zhu, Y., et al., "Phenoxazine-Based Conjugated Polymers: A New Class of Organic Semiconductors for Field-Effect Transistors", *Macromolecules* 2005, 38, 7983-7991.

* cited by examiner

*Primary Examiner*—Mark Kopec
(74) *Attorney, Agent, or Firm*—Eugene O. Palazzo; Fay Sharpe LLP

(57) ABSTRACT

An electronic device, such as a thin film transistor, containing a polymer of the formula or structure

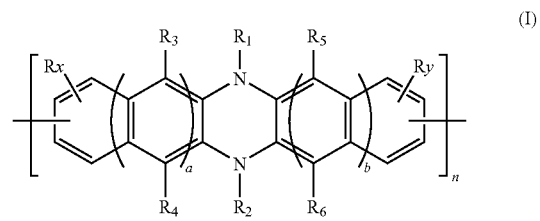

wherein at least one of each R, $R_1$, $R_2$, $R_3$, $R_4$, $R_5$ and $R_6$ is independently hydrogen, alkyl, aryl, alkoxy, halogen, arylalkyl, cyano, or nitro; x and y represent the number of R substituents; a and b represent the number of rings; and n represents the number of repeating groups or moieties.

27 Claims, 2 Drawing Sheets

POLYDIAZAACENES AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS REFERENCE TO RELATED APPLICATIONS

U.S. Pat. No. 7,372,071, filed concurrently herewith, on Functionalized Heteroacenes and Electronic Devices Generated Therefrom, by Yuning Li et al.

U.S. application Ser. No. 11/399,226, filed concurrently herewith, on Functionalized Heteroacenes, by Yuning Li et al.

U.S. application Ser. No. 11/399,216, filed concurrently herewith, on Polyacenes and Electronic Devices Generated Therefrom, by Yuning Li et al.

U.S. application Ser. No. 11/399,064, filed concurrently herewith, on Heteroacene Polymers and Electronic Devices Generated Therefrom, by Yuning Li et al.

U.S. application Ser. No. 11/399,169, filed concurrently herewith, on Ethynylene Acene Polymers and Electronic Devices Generated Therefrom, by Yuning Li et al.

U.S. application Ser. No. 11/399,091, filed concurrently herewith, on Ethynylene Acene Polymers, by Yuning Li et al.

U.S. Pat. No. 7,449,715, filed concurrently herewith, on Poly[bis(ethynyl)heteroacenes] and Electronic Devices Generated Therefrom, by Yuning Li et al.

U.S. application Ser. No. 11/399,141, filed concurrently herewith, on Semiconductors and Electronic Devices Generated Therefrom, by Yiliang Wu et al.

U.S. application Ser. No. 11/399,230, filed concurrently herewith, on Semiconductor Polymers, by Yiliang Wu et al.

U.S. application Ser. No. 11/398,931, filed concurrently herewith, on Polydiazaacenes, by Yiliang Wu et al.

U.S. application Ser. No. 11/399,246, filed concurrently herewith, on Poly(alkynylthiophene)s and Electronic Devices Generated Therefrom, by Beng S. Ong et al.

U.S. application Ser. No. 11/399,246, filed concurrently herewith, on Poly(alkynylthiophene)s, by Beng S. Ong et al.

U.S. application Ser. No. 11/399,092, filed concurrently herewith, on Linked Arylamine Polymers and Electronic Devices Generated Therefrom, by Yuning Li et al.

U.S. application Ser. No. 11/399,065, filed concurrently herewith, on Linked Arylamine Polymers, by Yuning Li et al.

Illustrated in U.S. application Ser. No. 11/011,678 filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference. In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in these copending applications and patent may be selected for the present invention in embodiments thereof.

BACKGROUND

The present disclosure is generally directed to polymers like polydiazaacenes, processes of preparation and uses thereof. More specifically, the present disclosure in embodiments is directed to novel polydiazaacenes selected as solution processable and substantially stable channel semiconductors in organic electronic devices, such as thin film transistors.

There are desired electronic devices, such as thin film transistors, TFTs, fabricated with polydiazaacenes, with excellent solvent solubility, which can be solution processable; and which devices possess mechanical durability and structural flexibility, characteristics which are desirable for fabricating flexible TFTs on plastic substrates. Flexible TFTs enable the design of electronic devices with structural flexibility and mechanical durability characteristics. The use of plastic substrates together with the polydiazaacene can transform the traditionally rigid silicon TFT into a mechanically more durable and structurally flexible TFT design. This can be of particular value to large area devices such as large-area image sensors, electronic paper, and other display media. Also, the selection of polydiazaacenes TFTs for integrated circuit logic elements for low end microelectronics, such as smart cards, radio frequency identification (RFID) tags, and memory/storage devices, is believed to enhance their mechanical durability, and thus their useful life span.

A number of semiconductor materials are not, it is believed, stable when exposed to air as they become oxidatively doped by ambient oxygen resulting in increased conductivity. The result is large off-current and thus a low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

TFTs fabricated from polydiazaacenes may be functionally and structurally more desirable than conventional silicon technology in that they may offer mechanical durability, structural flexibility, and the potential of being able to be incorporated directly onto the active media of the devices, thus enhancing device compactness for transportability.

REFERENCES

Regioregular polyhexylthiophenes undergo rapid photo oxidative degradation under ambient conditions, while the known polytriarylamines possess some stability when exposed to air, however, these amines are believed to possess low field effect mobilities, in some instances, disadvantages avoided, or minimized with the polydiazaacenes of the present disclosure.

Also, acenes, such as pentacene, and heteroacenes are known to possess acceptable high field effect mobility when used as channel semiconductors in TFTs. However, these materials are rapidly oxidized by, for example, atmospheric oxygen under light, and such acenes are not considered processable at ambient conditions. Furthermore, when selected for TFTs a number of known acenes have poor thin film formation characteristics and are substantially insoluble thus they are essentially nonsolution processable; accordingly, such acenes have been processed by vacuum deposition methods that result in high production costs, eliminated or minimized with the TFTs generated with the polydiazaacenes illustrated herein.

A number of organic semiconductor materials has been described for use in field effect TFTs, which materials include organic small molecules such as pentacene, see for example D. J. Gundlach et al., "Pentacene organic thin film transistors—molecular ordering and mobility", *IEEE Electron Device Lett.*, Vol. 18, p. 87 (1997); oligomers such as sexithiophenes or their variants, see for example reference F. Garnier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example, the reference Z. Bao et al., "Soluble and processable regioregular poly(3-hexylthiophene) for field-effect thin film transistor application with high mobility", *Appl. Phys. Lett.* Vol. 69, p4108 (1996). Although organic material based TFTs generally provide lower performance characteristics than their conventional silicon counterparts, such as silicon crystals or polysilicon TFTs, they may be nonetheless sufficiently useful for applications in areas where high mobility is not required.

Illustrated in Huang, D. H., et al, *Chem. Mater.* 2004, 16, 1298-1303, are, for example, LEDS and field effect transistors based on certain phenothiaazines like poly(10-(2-ethylhexyl)phenothiaazine).

Illustrated in Zhu, Y., et al, *Macromolecules* 2005, 38, 7983-7991, are, for example, semiconductors based on phenoxazine conjugated polymers like poly(10-hexylphenoxazine).

A number of known small molecule or oligomer-based TFT devices rely on difficult vacuum deposition techniques for fabrication. Vacuum deposition is selected primarily because the small molecular materials are either insoluble or their solution processing by spin coating, solution casting, or stamp printing do not generally provide uniform thin films.

Further, vacuum deposition may also involve the difficulty of achieving consistent thin film quality for large area format. Polymer TFTs, such as those fabricated from regioregular components, of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are sensitive to air. The TFTs fabricated from these materials in ambient conditions generally exhibit large off-current, very low current on/off ratios, and their performance characteristics degrade rapidly.

Additional references that may be of interest include U.S. Pat. Nos. 6,150,191; 6,107,117; 5,969,376; 5,619,357, and 5,777,070.

BRIEF DESCRIPTION OF THE FIGURES

Illustrated in FIGS. 1 to 4 are various representative embodiments of the present disclosure, and wherein polydiazaacenes, and more specifically, the polydiazaacenes wherein at least one of $R_1$ and $R_2$ is of dodecylphenyl, and n is about 50, are selected as the channel or semiconductor material in thin film transistor (TFT) configurations.

DESCRIPTION OF THE EXEMPLARY EMBODIMENTS

Figure 1:
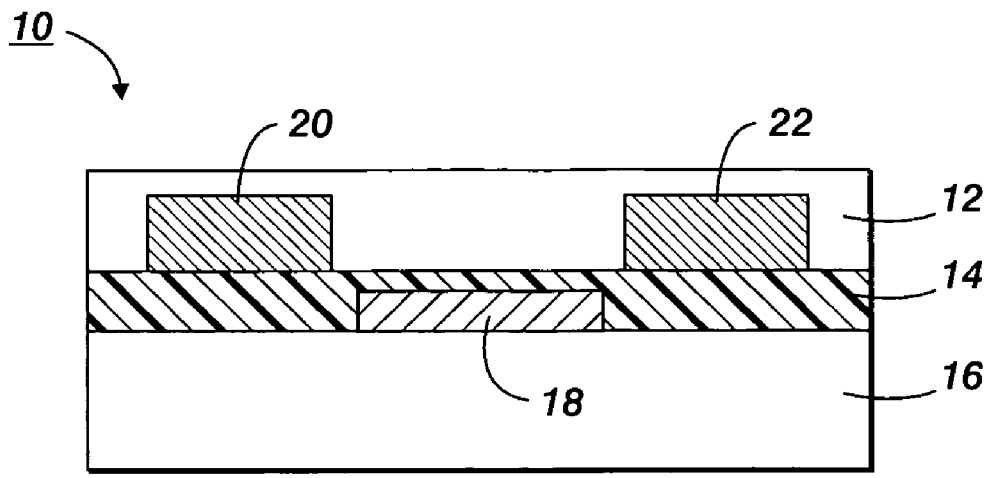

It is a feature of the present disclosure to provide semiconductor polydiazaacenes, which are useful for microelectronic device applications, such as TFT devices.

It is another feature of the present disclosure to provide polydiazaacenes with a band gap of from about 1.5 eV to about 3 eV as determined from the absorption spectra of thin films thereof, and which polydiazaacenes are suitable for use as TFT semiconductor channel layer materials and mobilities of from about $10^{-3}$ to about $10^{-1}$.

In yet a further feature of the present disclosure there are provided novel polydiazaacenes which are useful as microelectronic components, and which polydiazaacenes possess solubility of, for example, at least about 0.1 percent to about 95 by weight in common organic solvents, such as methylene chloride, tetrahydrofuran, toluene, xylene, mesitylene, chlorobenzene, dichlorobenzene, and the like, and thus these polydiazaacenes can be economically fabricated by liquid processes such as spin coating, screen printing, stamp printing, dip coating, solution casting, jet printing, and the like.

Another feature of the present disclosure resides in providing electronic devices, such as TFTs, with a polydiazaacene channel layer, and which layer has a conductivity of from about $10^{-4}$ to about $10^{-9}$ S/cm (Siemens/centimeter).

Also, in yet another feature of the present disclosure there are provided novel polydiazaacenes and devices thereof, and which devices exhibit enhanced resistance to the adverse effects of oxygen, that is, these devices exhibit relatively high current on/off ratios, and their performance does not substantially degrade as rapidly as similar devices fabricated with regioregular poly(3-alkylthiophene-3,5-diyl) or with acenes.

Additionally, in a further feature of the present disclosure there is provided a class of novel polydiazaacenes including those with two tertiary amine groups, which can stabilize radical cation,s and with unique structural features which permit molecular self-alignment under appropriate processing conditions, and which structural features also enhance the stability of device performance. Proper molecular alignment can permit higher molecular structural order in thin films, which can be important to efficient charge carrier transport, thus higher electrical performance.

There are disclosed in embodiments, polydiazaacenes and electronic devices thereof. In embodiments, polydiazaacene refers, for example, to polymer containing diazaacene structures. More specifically, the present disclosure relates to polydiazaacenes illustrated by or encompassed by Formula (I)

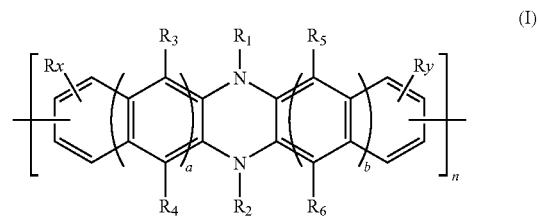

wherein, for example, x and y represent the number of R substituents of, for example, independently from 0 to about 3; a and b represent the number of the rings of, for example, from 0 to about 3; each R, $R_1$, $R_2$, $R_3$, $R_4$, $R_5$, and $R_6$ is independently, hydrogen, alkyl, aryl, alkoxy, arylalkyl, alkyl substituted aryls, halogen, cyano, nitro and the like; and mixtures thereof; and n represents the number of repeating units, such as for example, n is a number of from about 2 to about 5,000, and more specifically, from about 2 to about 500, or from about 10 to about 100.

The number average molecular weight ($M_n$) of the polydiazaacenes can be, for example, from about 500 to about 300,000, including from about 500 to about 100,000, and the weight average molecular weight ($M_w$) thereof can be from about 600 to about 500,000, including from about 600 to about 200,000, both as measured by gel permeation chromatography using polystyrene standards.

In embodiments, specific classes of polydiazaacenes are represented by the following formulas

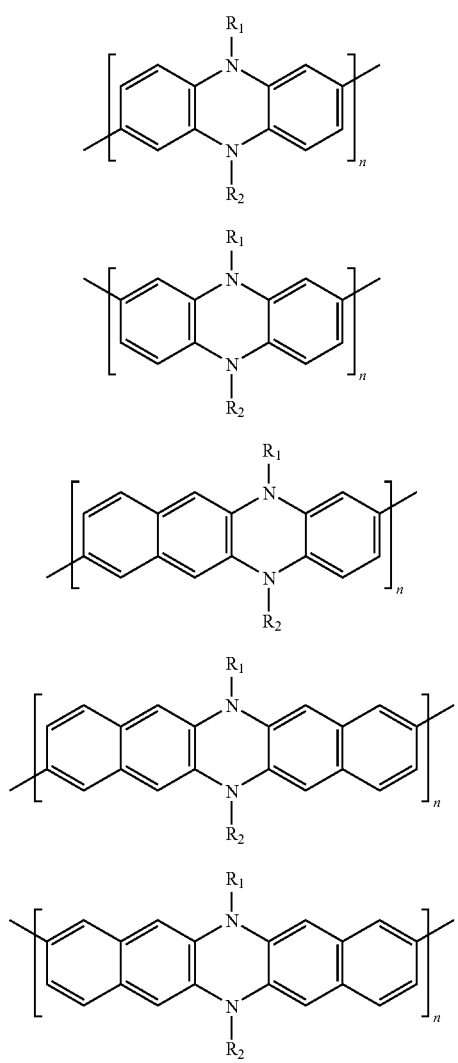

wherein each R and n is as illustrated herein, and more specifically, wherein each $R_1$ and $R_2$ is independently hydrogen, alkyl, aryl, alkoxy, arylalkyl, alkyl substituted aryls, and the like; and mixtures thereof; and n represents the number of repeating units, such as for example, n is a number of from about 2 to about 5,000, and more specifically, from about 2 to about 1,000 or from about 50 to about 700. In embodiments, $R_1$ and $R_2$ are alkyl, arylalkyl, and alkyl substituted aryls. Examples of specific $R_1$ and $R_2$ are alkyl with from about 5 to about 25 carbon atoms of, for example, pentyl, hexyl, heptyl, octyl, nonyl, decyl, undecyl, dodecyl, tridecyl, tetradecyl, pentadecyl, hexadecyl, heptadecyl and octadecyl; arylalkyl with from about 7 to about 26 carbon atoms of, for example, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl; or aryl with from about 6 to about 48 carbon atoms, such as phenyl.

In embodiments there are disclosed processes for the preparation of polydiazaacenes in accordance, for example, with the following reaction scheme (Scheme 1), and more specifically, where polydiazaacenes can be prepared by utilizing a dehalogenative coupling reaction of dihalogenated diazaacenes.

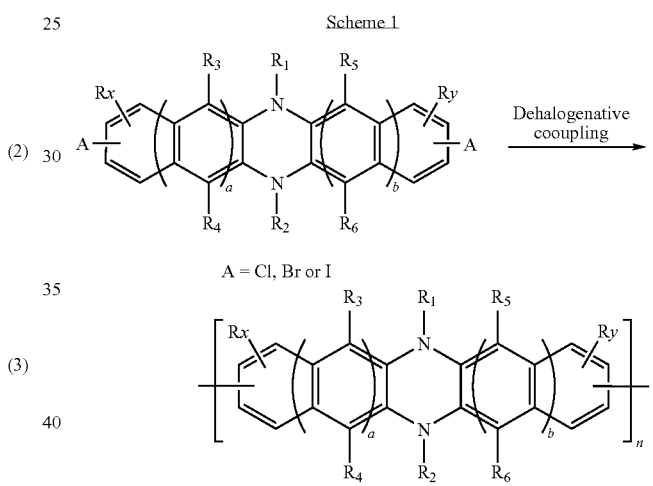

In Scheme 1, x and y represent the number of R substituents, each of them being, for example, independently from 0 to about 3; a and b represent the number of the rings, each of them being, for example, from 0 to about 3; each R, $R_1$, $R_2$, $R_3$, $R_4$, $R_5$ and $R_6$ is independently hydrogen, alkyl, aryl, alkoxy, arylalkyl, alkyl substituted aryls, halogen, cyano, nitro and the like, and mixtures thereof; and n represents the number of repeating units.

More specifically, the process for the preparation of the polydiazaacenes can be accomplished by, for example, the dehalogenative coupling polymerization of dichloro-diazaacenes in the presence of zinc, nickel(II) chloride, 2,2'-dipyridil, and triphenylphosphine in dimethylacetamide (DMAc) at an elevated temperature of, for example, about 70° C. to about 90° C., and more specifically, about 80° C. for a suitable period of time, like 24 hours, as illustrated in Scheme 2; wherein the monomer dichlordiazaacenes can be effectively achieved through a condensation reaction between a 1,2-aromatic diamine and a 1,2-aromatic diol at elevated temperatures, for example, from about 160° C. to about 180° C., for a suitable time like from about 30 to about 60 minutes, followed by reacting the product obtained with an aryliodide using excess copper and a catalytic amount of an 18-crown-6 ether in refluxing 1,2-dichlorobenzene for about 24 hours (Scheme 2).

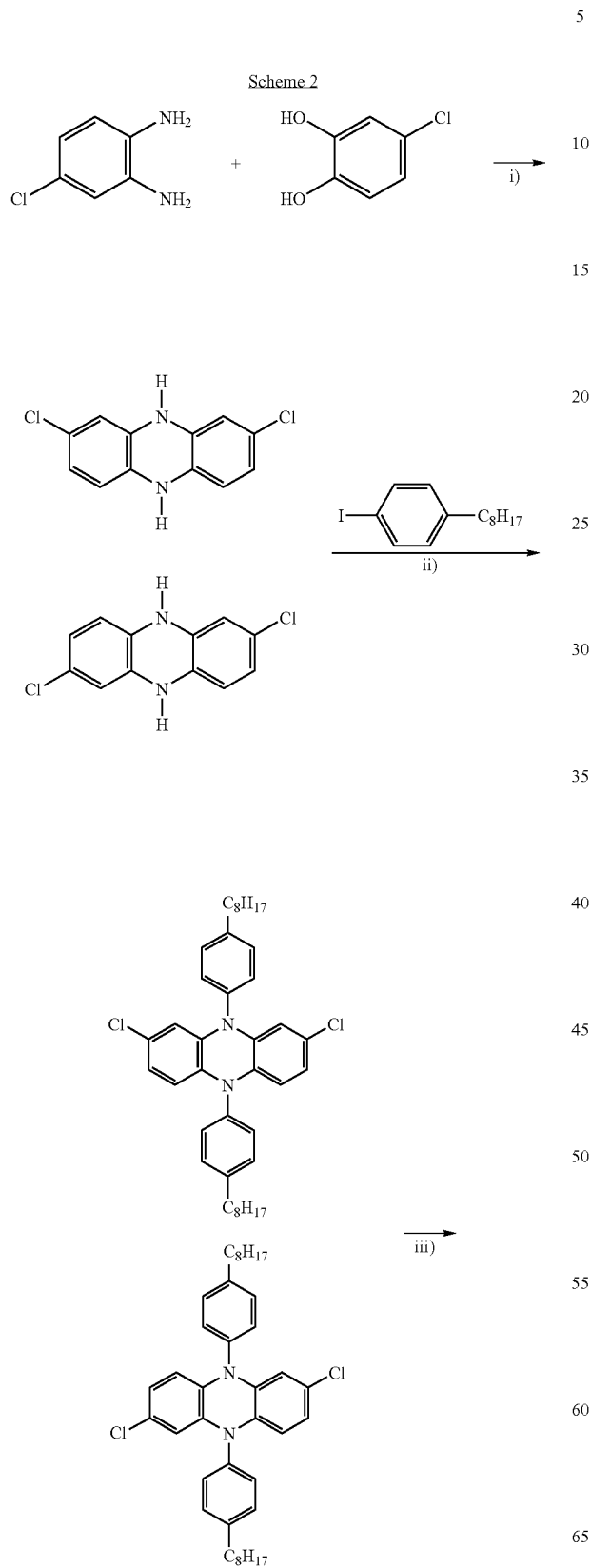

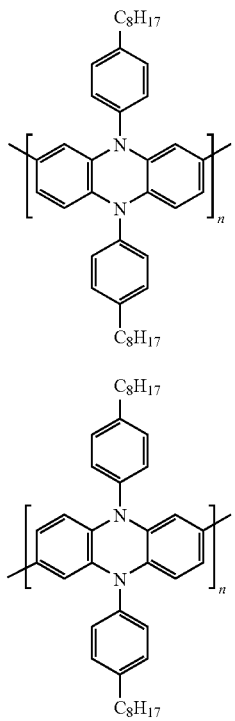

and wherein i) is accomplished by heating at elevated temperatures, for example, at 180° C., for a suitable time period like from about 30 to about 60 minutes; ii) followed by adding copper powder, 18-crown-6 ether, 1,2-dichlorobenzene, and refluxing for a suitable period, such as about 24 hours or other suitable time; iii) adding Zn, $NiCl_2$, 2,2'-bipyridil, $PPh_3$, DMAc, and heating at elevated temperature of, for example, about 80° C.

Examples of each of the R, $R_1$, $R_2$, $R_3$, $R_4$, $R_5$ and $R_6$ groups for the polydiazaacenes are as illustrated herein, and include alkoxy and alkyl with, for example, from about 1 to about 25, including from about 1 to about 18 carbon atoms (included throughout are numbers within the range, for example 4, 5, 6, 7, 8, 9, 10, 11, 12, 13, 14, 15, 16, 17 and 18), and further including from about 6 to about 16 carbon atoms, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, isomeric forms thereof, mixtures thereof, and the like, and the corresponding alkoxides, such as propoxy, butoxy, octoxy, and the like; alkylaryl with from about 7 to about 49 carbon atoms, from about 7 to about 37 carbon atoms, or from about 13 to about 25 carbon atoms, such as methylphenyl, octylphenyl, dodecylphenyl, and substituted phenyls; aryl with from 6 to about 48 carbon atoms, and more specifically, with from about 6 to about 18 carbon atoms, such as phenyl, biphenyl; and halogen of chloride, bromide, fluoride or iodide.

Specific illustrative polymer examples are

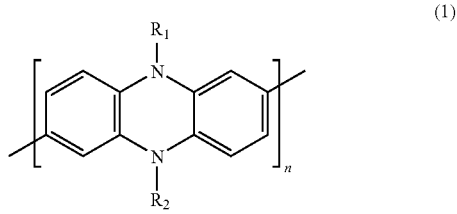

-continued

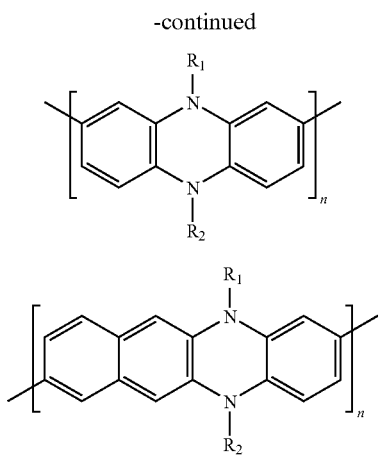

wherein $R_1$ is alkyl, $R_2$ is alkyl, and n is a number of from 2 to about 100.

The polydiazaacenes in embodiments are soluble or substantially soluble in common coating solvents, for example, in embodiments they possess a solubility of at least about 0.1 percent to about 95 percent by weight, and more specifically, from about 0.5 percent to about 10 percent by weight in such solvents as methylene chloride, 1,2-dichloroethane, tetrahydrofuran, toluene, xylene, mesitylene, chlorobenzene, dichlorobenzene, and the like. Moreover, the polydiazaacenes of the present disclosure in embodiments, when fabricated as semiconductor channel layers in TFT devices, provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the polydiazaacenes when fabricated from solutions as thin films of, for example, from about 10 nanometers to about 500 nanometers, or from about 50 to about 300 nanometers in thickness, are more stable in ambient conditions than similar devices fabricated from acenes like pentacene and its derivatives or from polyacenes. When unprotected, the aforementioned polydiazaacenes materials and devices are generally stable for a number of weeks rather than days or hours as is the situation with poly(3-alkylthiophene-2,5-diyl) after exposure to ambient oxygen, thus the devices fabricated from the polydiazaacenes in embodiments of the present disclosure can provide higher current on/off ratios, and their performance characteristics do not substantially change as rapidly as pentacene or than poly(3-alkylthiophene-2,5-diyl) when no rigorous procedural precautions have been taken to exclude ambient oxygen during material preparation, device fabrication, and evaluation. The polydiazaacenes stability of the present disclosure in embodiments against oxidative doping, particularly for low cost device manufacturing, does not usually have to be handled in an inert atmosphere, and the processes thereof are, therefore, simpler and more cost effective, and the fabrication thereof can be applied to large scale production processes.

Aspects of the present disclosure relate to an electronic device comprising a semiconductive material of Formula (I)

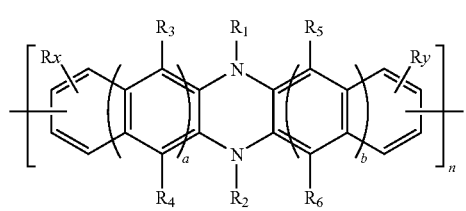

wherein at least one of each R, $R_1$, $R_2$, $R_3$, $R_4$, $R_5$ and $R_6$ is independently hydrogen, alkyl, aryl, alkoxy, halogen, arylalkyl, cyano, or nitro; x and y represent the number of R substituents; a and b represent the number of rings; and n represents the number of repeating groups or moieties; a thin film transistor of a substrate, a gate electrode, a gate dielectric layer, a source electrode and a drain electrode, and in contact with the source/drain electrodes and the gate dielectric layer a semiconductor layer comprised of a polydiazaacene of the formula

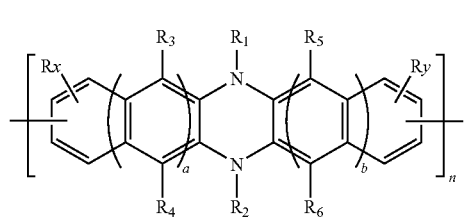

wherein at least one of each R, $R_1$, $R_2$, $R_3$, $R_4$, $R_5$ and $R_6$ is independently hydrogen, alkyl, aryl, alkoxy, halogen, arylalkyl, cyano, or nitro; x and y represent the number of R substituents; a and b represent the number of rings; and n represents the number of repeating groups or moieties; an electronic device comprising a semiconductive material containing a polydiazaacene, and wherein the device is a thin film transistor and the polydiazaacene is selected from the group consisting of those of formulas/structures

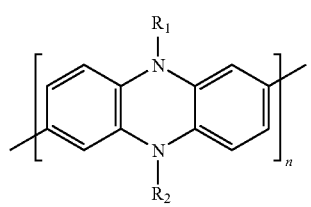

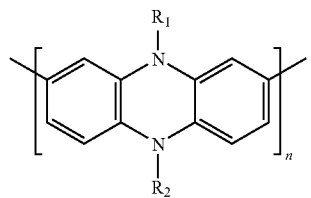

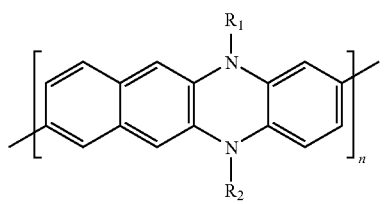

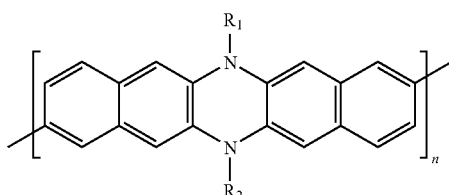

-continued

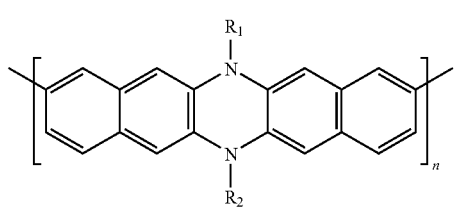

(5)

wherein $R_1$ and $R_2$ are independently alkyl with from about 5 to about 20 carbon atoms, aryl with from about 6 to about 36 carbon atoms, or arylalkyl with from about 7 to about 26 carbon atoms; and n is from about 2 to about 100; a polymer represented by Formula or structure (I)

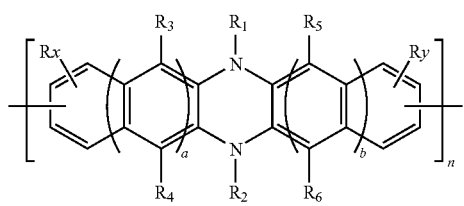

(I)

wherein at least one of each R, $R_1$, $R_2$, $R_3$, $R_4$, $R_5$ and $R_6$ is independently hydrogen, alkyl, aryl, arylalkyl, alkoxy, halogen, cyano, or nitro; x, y, a and b represent the number of groups and rings, respectively; and n represents the number of repeating groups or moieties; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate) or poly(vinyl phenol); a device wherein the polydiazaacene layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; device or devices include electronic devices such as TFTs.

DETAILED DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 with the gate electrode having a portion thereof or the entire gate in contact with the dielectric layer 14 on top of which layer 14 two metal contacts, 20 and 22 (source and drain electrodes), are deposited. Over and between the metal contacts 20 and 22 is the Formula (1) or Formula (4) polydiazaacene layer 12 wherein $R_1$ and $R_2$ are $C_8H_{17}$ phenyl. The gate electrode can be included in the substrate, in the dielectric layer, and the like throughout.

Figure 2:
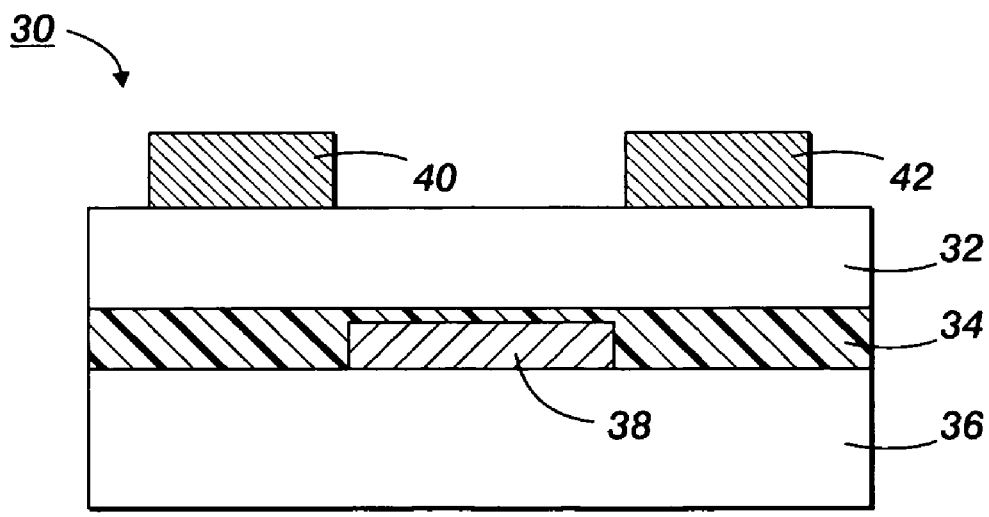

FIG. 2 schematically illustrates another TFT configuration 30 comprised of a substrate 36, a gate electrode 38, a source electrode 40, and a drain electrode 42, an insulating dielectric layer 34, and a polydiazaacene semiconductor layer 32 of Formula (1) of FIG. 1.

Figure 3:
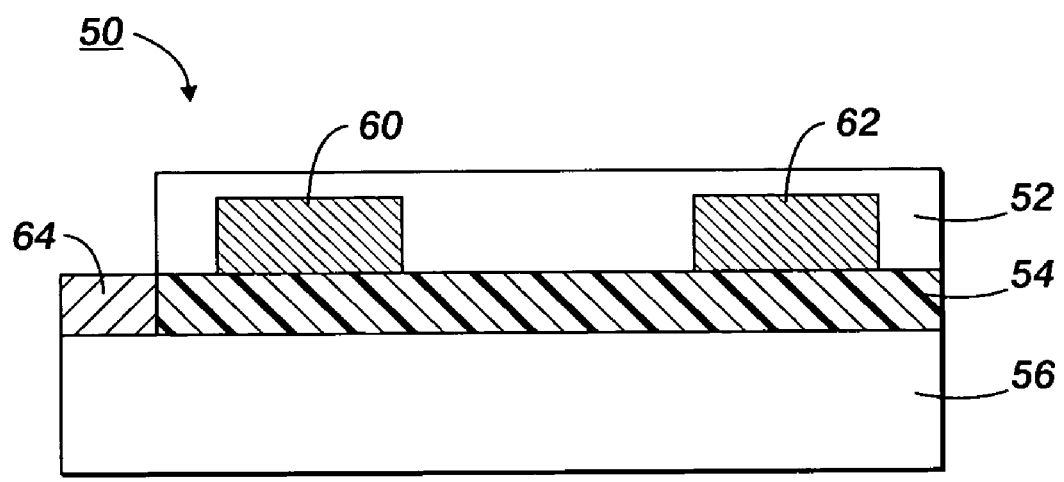

FIG. 3 schematically illustrates a further TFT configuration 50 comprised of a heavily n-doped silicon wafer 56, which can act as a gate electrode, a thermally grown silicon oxide dielectric layer 54, a polydiazaacene semiconductor layer 52 of Formula (1) or Formula (4) of FIG. 1, on top of which are deposited a source electrode 60 and a drain electrode 62; and a gate electrode contact 64.

Figure 4:
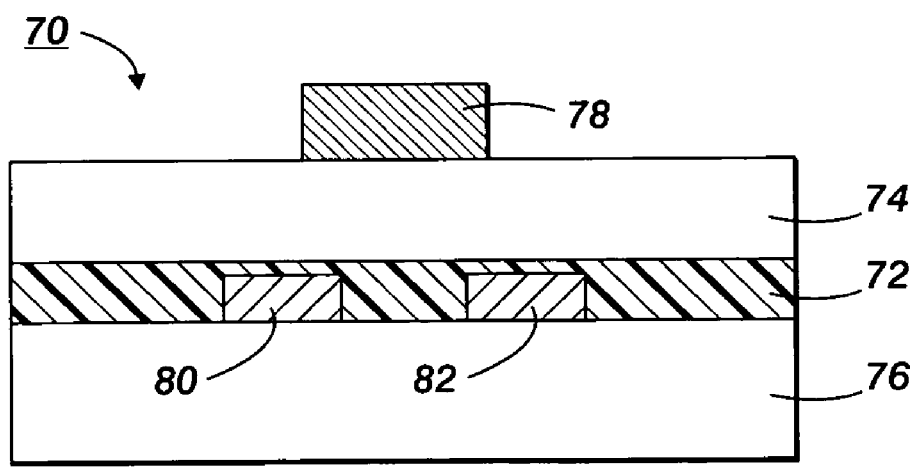

FIG. 4 schematically illustrates a TFT configuration 70 comprised of substrate 76, a gate electrode 78, a source electrode 80, a drain electrode 82, a polydiazaacene semiconductor layer 72 of Formula (1) or Formula (4) of FIG. 1, and an insulating dielectric layer 74.

Also, other devices not disclosed, especially TFT devices, are envisioned, reference for example known TFT devices.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the polydiazaacene illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the polydiazaacenes of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials, such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters, with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally, for example, about +10 volts to about −80 volts is applied to the gate electrode.

Although not desiring to be limited by theory, it is believed that the diaza groups function primarily to minimize or avoid instability because of exposure to oxygen, and thus increase the oxidative stability of the polydiazaacene in solution under ambient conditions, and the R and $R_1$ through $R_6$ substituents, such as alkyl, permit the solubility of these polymers in common solvents, such as ethylene chloride.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a semiconductive material of Formula (I)

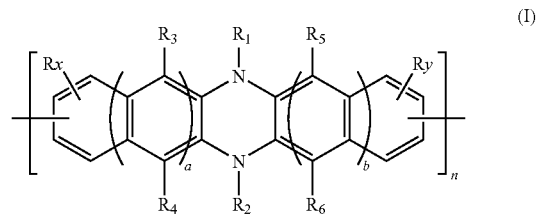

wherein each R, $R_1$, $R_2$, $R_3$, $R_4$, $R_5$ and $R_6$ is independently selected from the group consisting of hydrogen, alkyl, aryl, alkoxy, halogen, arylalkyl, alkylaryl, cyano, or nitro; x and y represent the number of R substituents; a and b represent the number of rings; and n represents the number of repeating groups or moieties;

wherein at least one of $R_1$ and $R_2$ is not hydrogen;

wherein x, y, a, and b are independently from 0 to about 3; and wherein n represents a number from 2 to about 5,000.

2. A device in accordance with claim 1 wherein n represents a number of from about 100 to about 1,000, or from about 10 to about 200.

3. A device in accordance with claim 1 wherein n represents a number of from about 20 to about 100.

4. A device in accordance with claim 1 wherein at least one of R, $R_1$, $R_2$, $R_3$, $R_4$, $R_5$ and $R_6$ is alkyl.

5. A device in accordance with claim 1 wherein at least one of R, $R_1$, $R_2$, $R_3$, $R_4$, $R_5$ and $R_6$ is aryl.

6. A device in accordance with claim 1 wherein at least one of R, $R_1$, $R_2$, $R_3$, $R_4$, $R_5$ and $R_6$ is nitro or cyano.

7. A device in accordance with claim 1 wherein at least one of R, $R_1$, $R_2$, $R_3$, $R_4$, $R_5$ and $R_6$ is selected from the group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, phenyl, octylphenyl, dodecylphenyl, octoxyphenyl, and dodecyloxyphenyl.

8. A device in accordance with claim 1 wherein said semiconductive material is a polydiazaacene as represented by

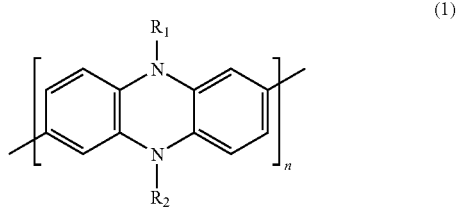

-continued

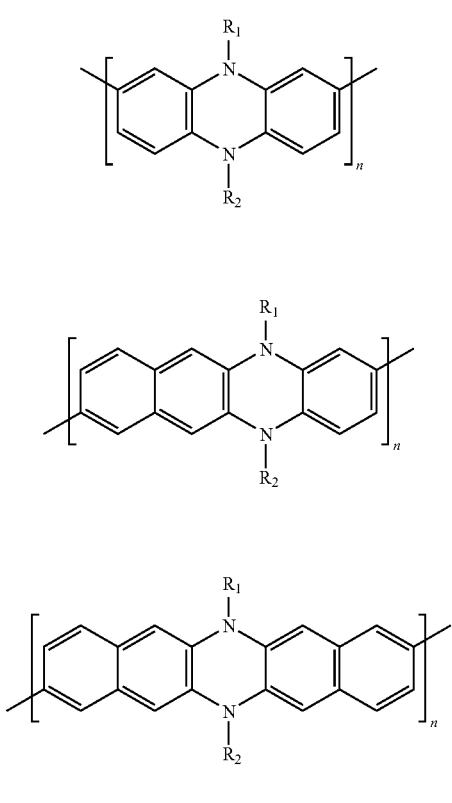

wherein at least one of $R_1$ and $R_2$ is independently alkyl with from about 5 to about 20 carbon atoms; and n is from 2 to about 100.

9. A device in accordance with claim 8 wherein said alkyl is selected from the group consisting of pentyl, hexyl, heptyl, octyl, nonyl, decyl, undecyl, dodecyl, tridecyl, tetradecyl, pentadecyl, hexadecyl, heptadecyl or octadecyl.

10. A device in accordance with claim 1 wherein at least one of R, $R_1$, $R_2$, $R_3$, $R_4$, $R_5$ and $R_6$ is aryl.

11. A device in accordance with claim 1 wherein at least one of R, $R_1$, $R_2$, $R_3$, $R_4$, $R_5$ and $R_6$ is alkylaryl or alkoxy.

12. A device in accordance with claim 1 wherein alkyl and alkoxy contain from about 1 to about 25 carbon atoms.

13. A device in accordance with claim 1 wherein aryl contains from 6 to about 48 carbon atoms.

14. A device in accordance with claim 1 wherein aryl contains from 6 to about 18 carbon atoms.

15. A thin film transistor comprising a substrate, a gate electrode, a gate dielectric layer, a source electrode and a drain electrode, and in contact with the source/drain electrodes and the gate dielectric layer a semiconductor layer comprised of a polydiazaacene of the formula

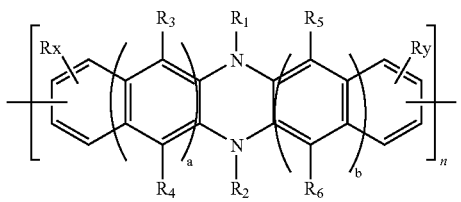

wherein each R, $R_1$, $R_2$, $R_3$, $R_4$, $R_5$ and $R_6$ is independently selected from the group consisting of hydrogen, alkyl, aryl, alkoxy, halogen, arylalkyl, alkylaryl, cyano, or nitro; x and y represent the number of R substituents; a and b represent the number of rings; and n represents the number of repeating groups or moieties;

wherein at least one of $R_1$ and $R_2$ is not hydrogen;

wherein a, b, x, and y are independently from 0 to about 3; and wherein n represents a number from 2 to about 5,000.

16. A device in accordance with claim 15 wherein alkyl is selected from the group consisting of butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, and eicosanyl; and n is from about 10 to about 100.

17. A device in accordance with claim 15 wherein said polydiazaacene is of the following alternative formulas

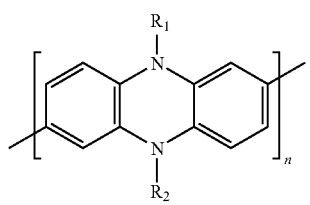

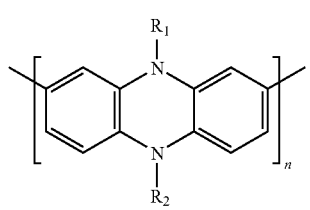

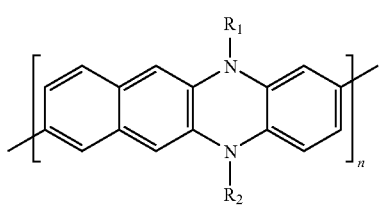

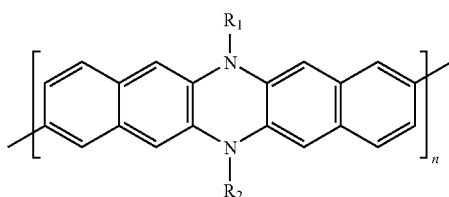

-continued

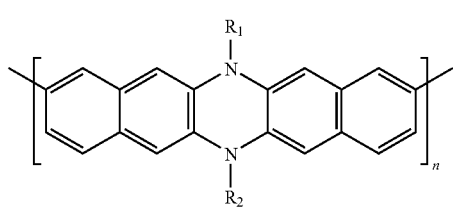

(5)

wherein R$_1$ and R$_2$ are independently alkyl, aryl or alkylaryl with from about 7 to about 26 carbon atoms; and n is from 2 to about 100.

18. A device in accordance with claim 17 wherein alkylaryl is selected from the group consisting of methylphenyl, ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl.

19. A device in accordance with claim 15 wherein said polydiazaacene is of the following formulas

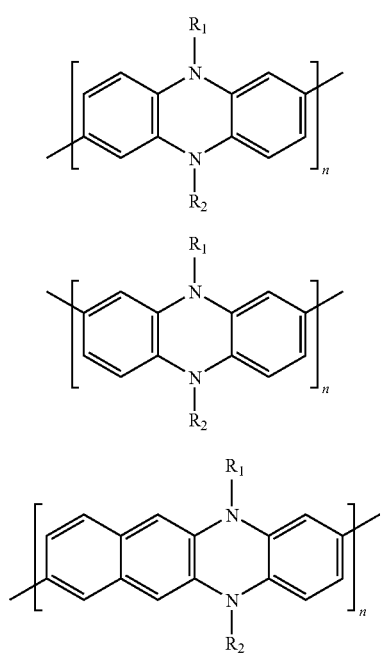

(1)

(2)

(3)

wherein at least one of R$_1$ and R$_2$ is dodecylphenyl; and n is from 5 to about 50.

20. A device in accordance with claim 15 wherein said substrate is a plastic sheet of a polyester, a polycarbonate, or a polyimide; said gate source and drain electrodes are each independently comprised of silver, gold, nickel, aluminum, chromium, platinum, or indium titanium oxide, or a conductive polymer, and said gate dielectric layer is comprised of inorganic nitrides or oxides, or organic polymers, silicon nitride, silicon oxide.

21. A device in accordance with claim 15 wherein said substrate is glass or a plastic sheet; said gate, source and drain electrodes are each comprised of silver, gold, or chromium, and said gate dielectric layer is comprised of the poly(methacrylate), polysiloxane, or poly(vinyl phenol); and wherein said polydiazaacene is deposited by solution processes of spin coating, stamp printing, screen printing, or jet printing.

22. A device in accordance with claim 15 wherein alkoxy contains from 1 to about 25 carbon atoms.

23. A device in accordance with claim 15 wherein halogen is selected from the group consisting of chloride, fluoride, bromide and iodide.

24. A device in accordance with claim 15 wherein alkoxy is selected from the group consisting of methoxy, ethoxy, butoxy, propoxy, and pentoxy.

25. A device in accordance with claim 15 wherein aryl is phenyl, alkyl contains from 5 to about 18 carbon atoms, and n is from 10 to about 75.

26. A device in accordance with claim 15 wherein at least one of R to R$_6$ is alkyl with from 1 to about 20 carbon atoms, alkoxy with from 1 to about 20 carbon atoms, aryl with from 6 to about 36 carbon atoms, or alkylaryl with from 7 to about 37 carbon atoms; and n is an integer of from 10 to about 200.

27. An electronic device comprising a semiconductive material containing a polydiazaacene, and wherein said device is a thin film transistor and said polydiazaacene is selected from the group consisting of those of formulas/structures

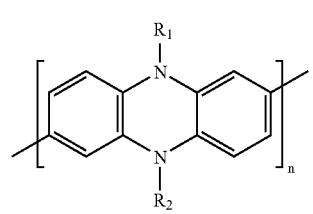

(1)

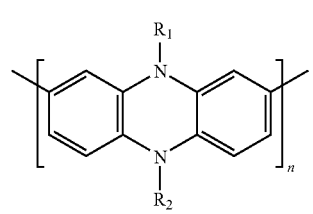

(2)

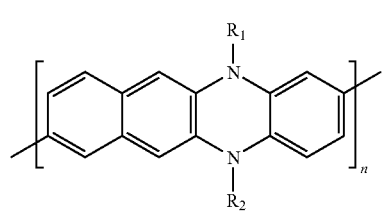

(3)

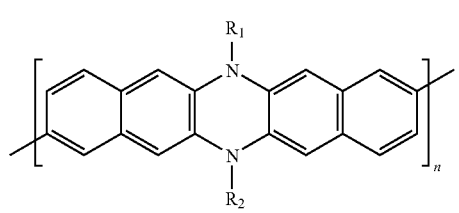

(4)

-continued
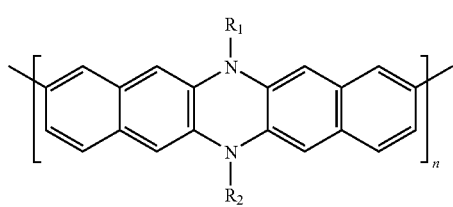
(5)
wherein $R_1$ and $R_2$ are independently alkyl with from about 5 to about 20 carbon atoms, aryl with from about 6 to about 36 carbon atoms, or alkylaryl with from about 7 to about 26 carbon atoms; and n is from 2 to about 100.
* * * * *

UNITED STATES PATENT AND TRADEMARK OFFICE
CERTIFICATE OF CORRECTION

| | |
|---|---|
| PATENT NO. | : 7,517,477 B2 |
| APPLICATION NO. | : 11/398941 |
| DATED | : April 14, 2009 |
| INVENTOR(S) | : Yiliang Wu et al. |

It is certified that error appears in the above-identified patent and that said Letters Patent is hereby corrected as shown below:

In the Specification:

Column 1, line 9, after "Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*